(12) United States Patent
Yang et al.

(10) Patent No.: US 12,094,874 B2
(45) Date of Patent: Sep. 17, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Sung-Hsin Yang, Hsinchu (TW); Jung-Chi Jeng, Tainan (TW); Ru-Shang Hsiao, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 496 days.

(21) Appl. No.: 17/460,200

(22) Filed: Aug. 28, 2021

(65) Prior Publication Data
US 2023/0067587 A1 Mar. 2, 2023

(51) Int. Cl.
| | |
|---|---|
| *H01L 27/02* | (2006.01) |
| *H01L 21/8238* | (2006.01) |
| *H01L 27/06* | (2006.01) |
| *H01L 27/092* | (2006.01) |
| *H01L 29/40* | (2006.01) |
| *H01L 29/423* | (2006.01) |
| *H01L 29/66* | (2006.01) |

(52) U.S. Cl.
CPC .... *H01L 27/0688* (2013.01); *H01L 21/82385* (2013.01); *H01L 21/823878* (2013.01); *H01L 21/823892* (2013.01); *H01L 27/092* (2013.01); *H01L 29/401* (2013.01); *H01L 29/42356* (2013.01); *H01L 29/42376* (2013.01); *H01L 29/66545* (2013.01)

(58) Field of Classification Search
None
See application file for complete search history.

(56) References Cited

U.S. PATENT DOCUMENTS

2021/0143181 A1* 5/2021 Seo ............... H01L 27/0924

* cited by examiner

*Primary Examiner* — Joseph C. Nicely
*Assistant Examiner* — Lamont B Koo
(74) *Attorney, Agent, or Firm* — FOLEY & LARDNER LLP

(57) ABSTRACT

A semiconductor device includes a semiconductor substrate. The semiconductor device includes a first three-dimensional semiconductor structure of a first conductivity type protruding from a surface of the semiconductor substrate. The semiconductor device includes a second three-dimensional semiconductor structure of a second conductivity type protruding from the surface of the semiconductor substrate. The semiconductor device includes a first transistor having a first source/drain structure formed in the first three-dimensional semiconductor structure, a second source/drain structure formed in the second three-dimensional semiconductor structure, a first gate structure straddling a first portion of the first three-dimensional semiconductor structure and a first portion of the second three-dimensional semiconductor structure, and a second gate structure straddling a second portion of the second three-dimensional semiconductor structure.

20 Claims, 9 Drawing Sheets

SEMICONDUCTOR DEVICES AND METHODS OF MANUFACTURING THEREOF

BACKGROUND

The present disclosure generally relates to semiconductor devices, and particularly to high-voltage semiconductor devices.

Size reduction of complementary metal-oxide-semiconductor (CMOS) devices, such as transistors, has enabled the continued improvement in speed, performance, density, and cost per unit function of integrated circuits over the past few decades. As sizes are reduced, there has been a trend to integrate more functions on a single chip, some of which operate with higher voltage levels. Such devices are sometimes referred to as "high-voltage transistors."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
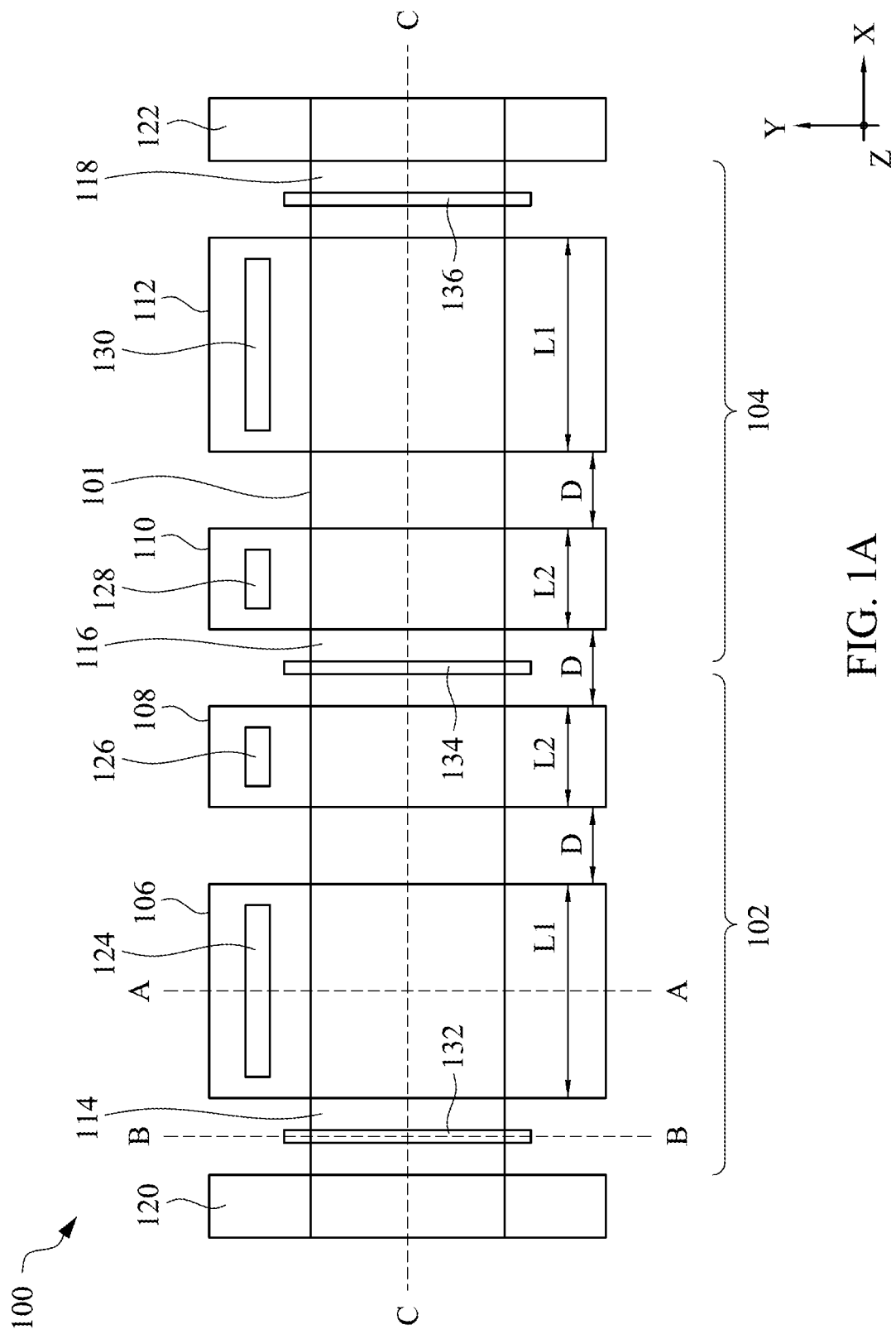
FIG. 1A illustrates a top view of an example semiconductor device that includes two high-voltage transistors, in accordance with various embodiments, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device including one or more high-voltage transistors. Each high-voltage transistor, as disclosed herein, may include multiple gate structures. Each of the gate structures may be disposed over a three-dimensional active structure (e.g., a channel) that is configured to conduct current, when the high-voltage transistor is in operation. For example, the gate structure may straddle a mesa-like active structure. In another example, the gate structure may straddle each of a number of fin-like active structures. By having multiple gate structures, each of the high-voltage transistors can operate under a relatively high voltage level, e.g., when compared to existing high-voltage transistors. For example, one of the gate structures may be applied with a voltage having a polarity, and another one of the gate structures may be applied with the same voltage but having the opposite polarity. As such, the high-voltage transistor can operate under at least two times the applied voltage.

Figure 1B:
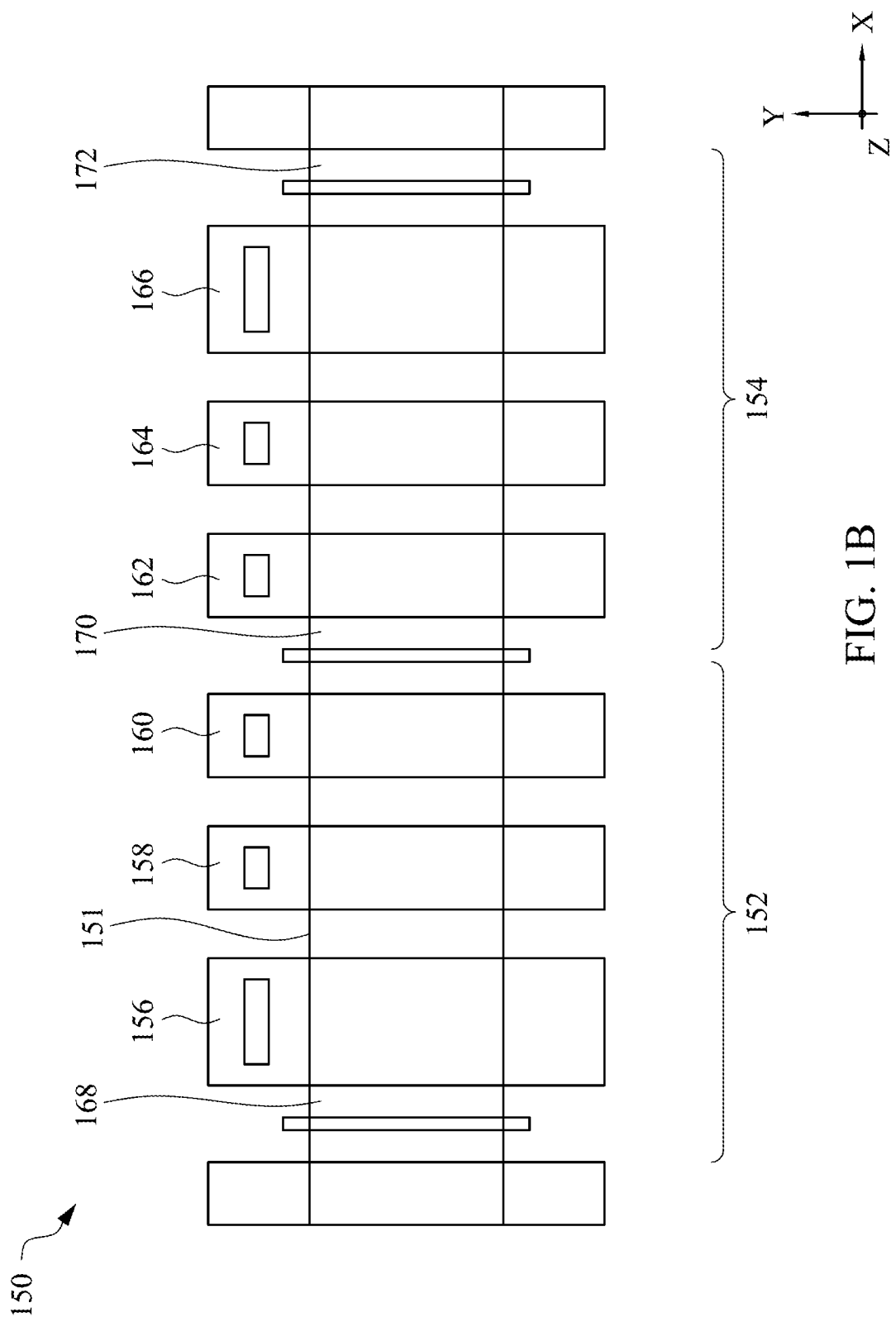
FIG. 1B illustrates a top view of another example semiconductor device that includes two high-voltage transistors, in accordance with various embodiments, in accordance with some embodiments.
Figure 2A:
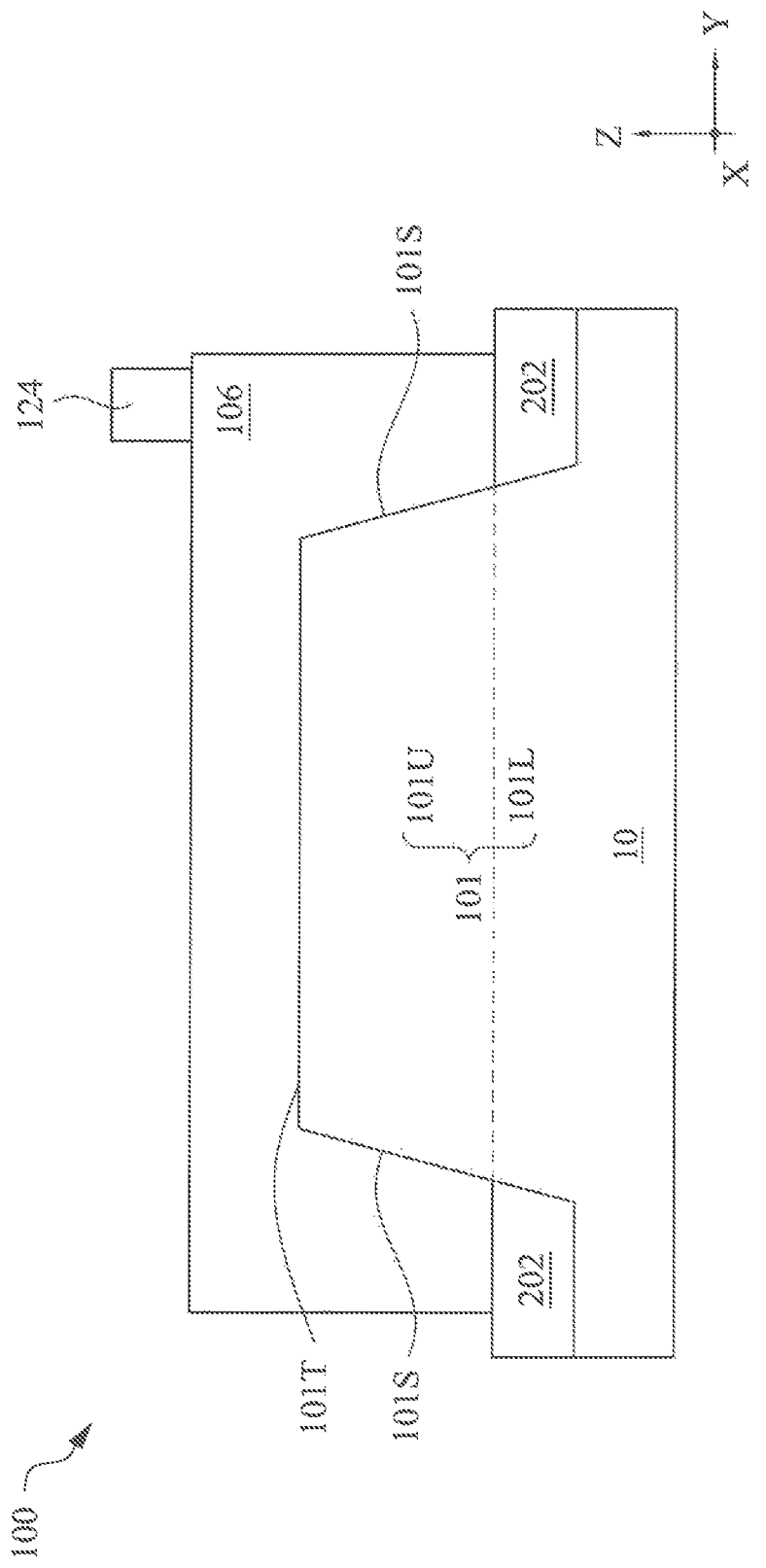
FIGS. 2A, 2B, and 2C illustrate cross-sectional views of the example semiconductor device of FIG. 1A, in which the active structure is formed as a mesa-like structure, a number of fin-like structures, and a well, respectively, in accordance with some embodiments.
Figure 2B:
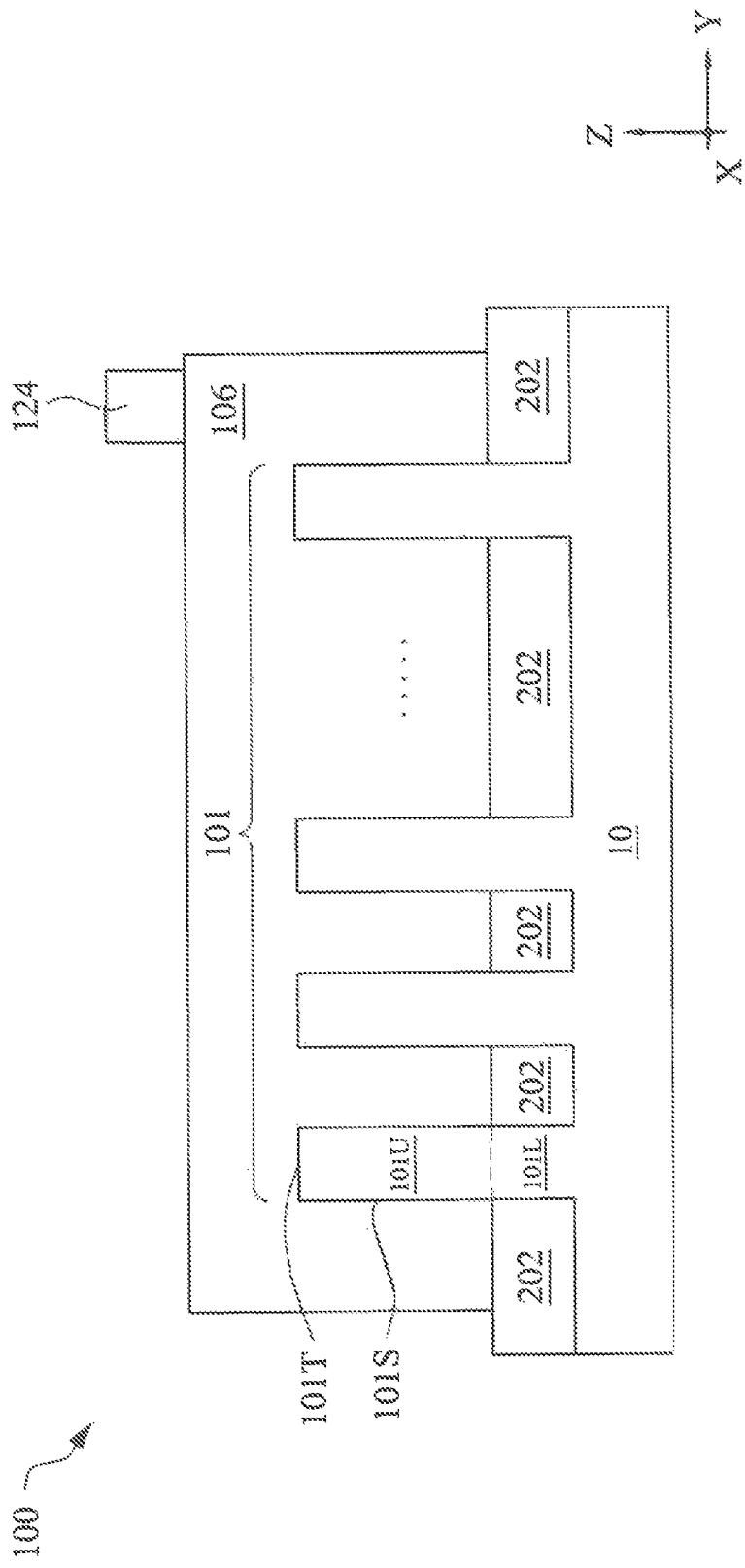
Figure 2C:
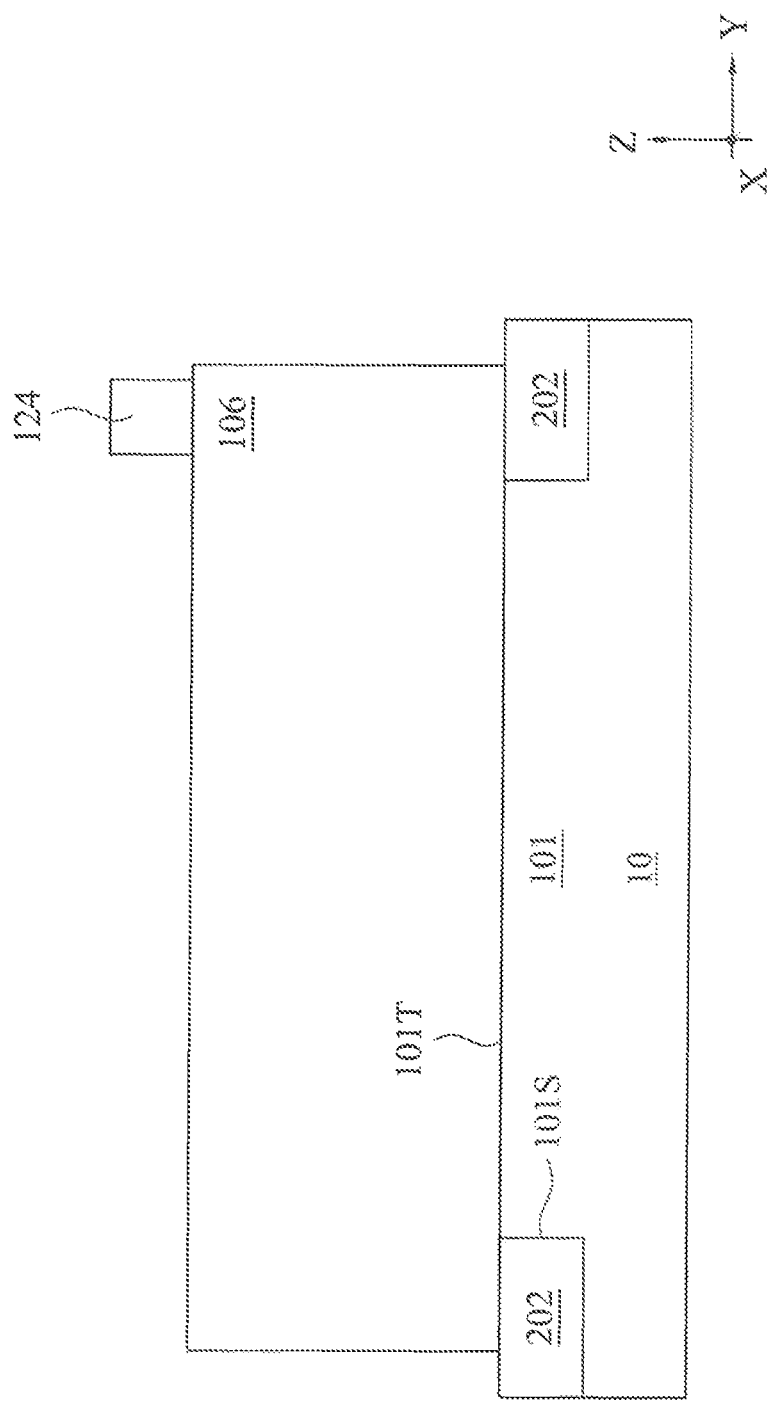
Figure 3:
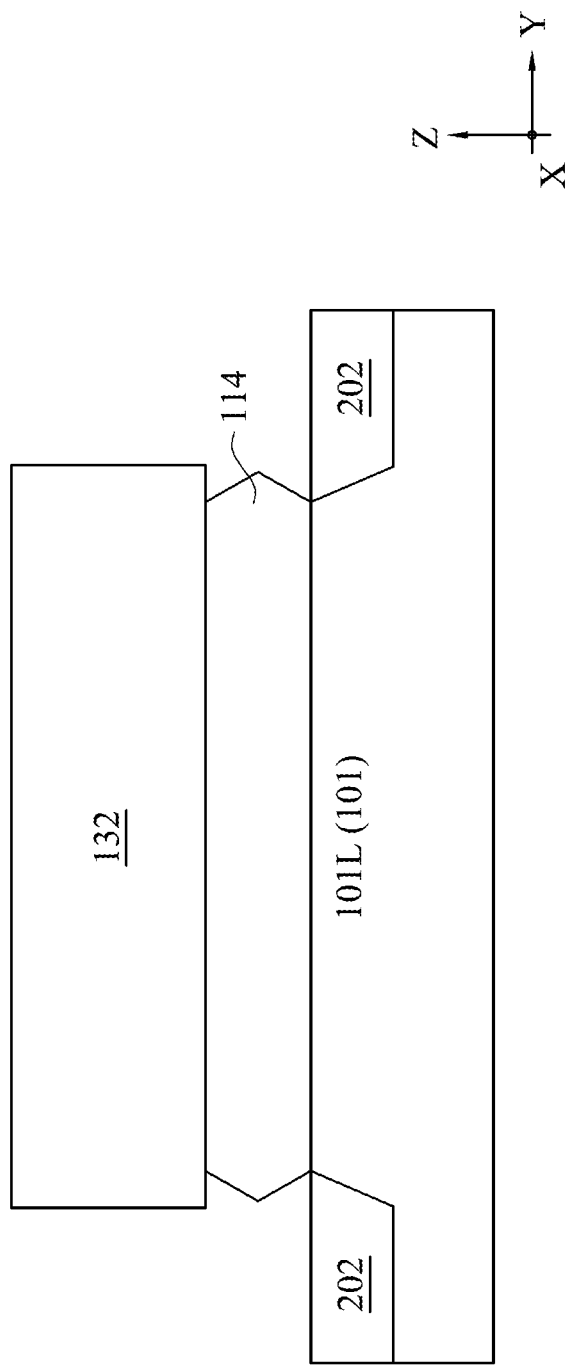
FIG. 3 illustrates a cross-sectional view of the example semiconductor device of FIG. 1A, where a source/drain structure is formed, in accordance with some embodiments.
Figure 4A:
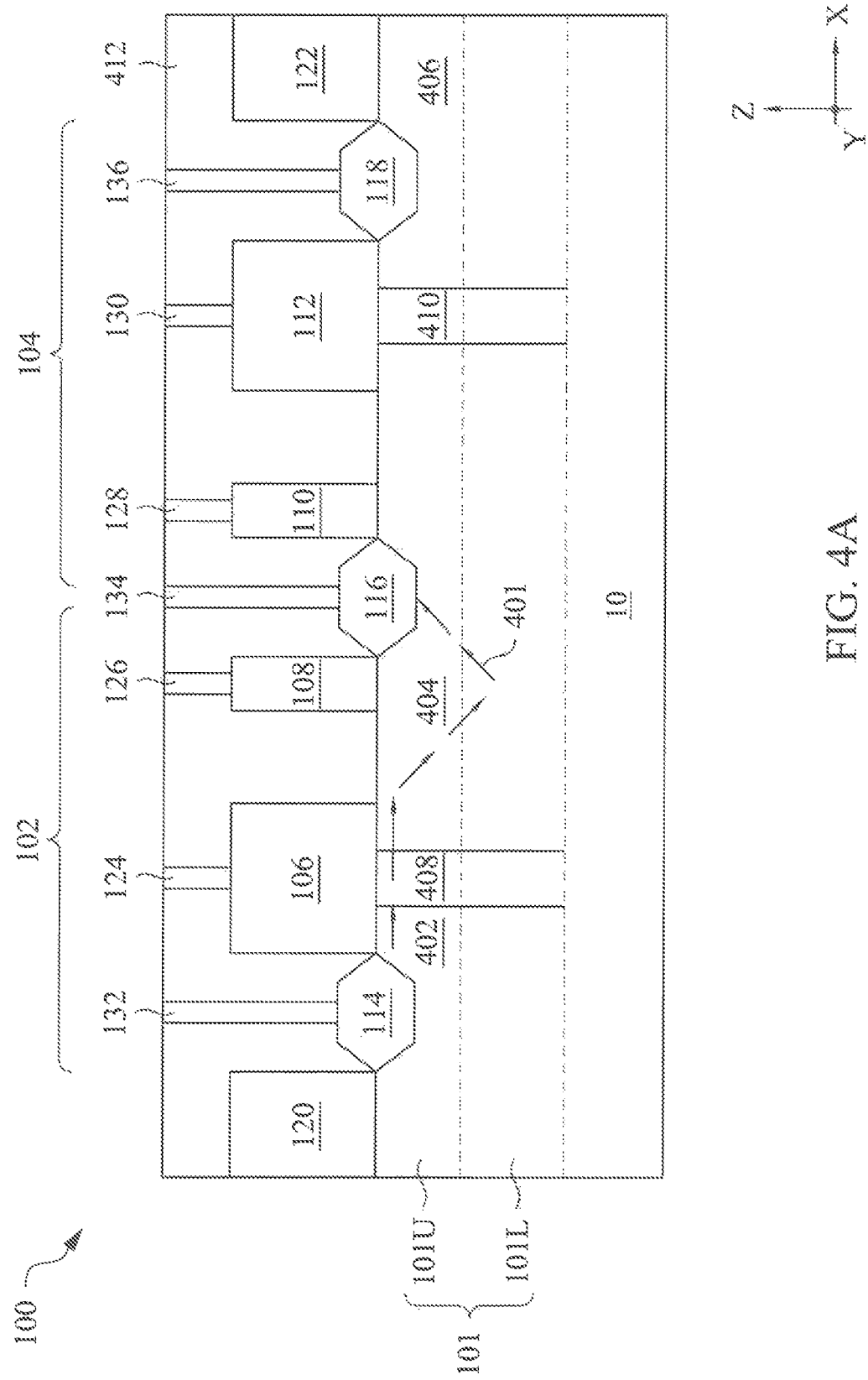
FIGS. 4A and 4B illustrate cross-sectional views of the example semiconductor device of FIG. 1A, with and without a deep well, respectively, in accordance with some embodiments.
Figure 4B:
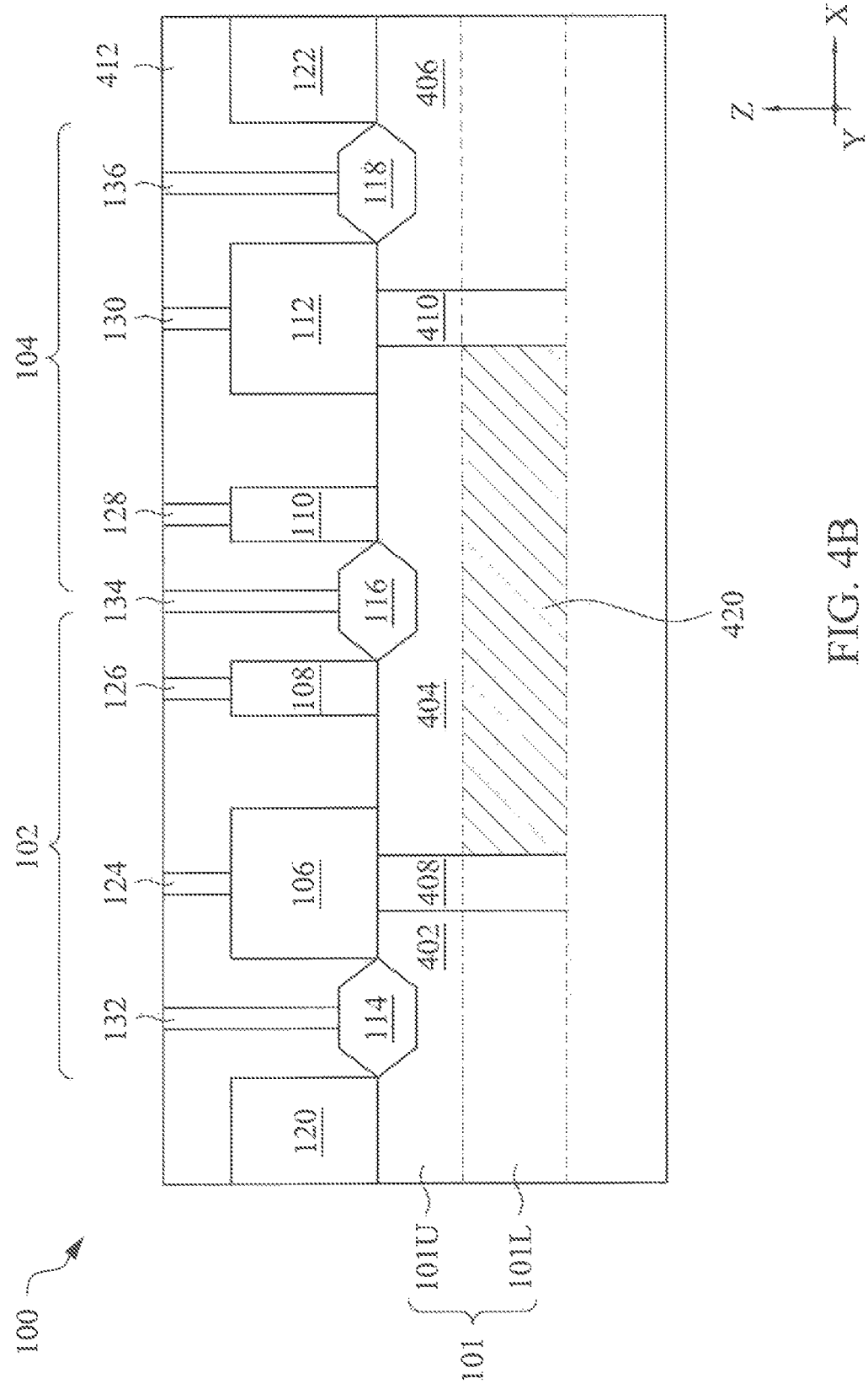

FIG. 1A illustrates a top view (e.g., a layout view) of an example semiconductor device 100 that includes two high-voltage transistors 102 and 104, in accordance with various embodiments. FIG. 1B illustrates a top view of another example semiconductor device 150 that also includes two high-voltage transistors 152 and 154, in accordance with various embodiments. FIGS. 2A, 2B, and 2C illustrate cross-sectional views of the example semiconductor device 100, cut along line A-A (as indicated in FIG. 1A), in which the active structure is formed as a mesa-like structure, a number of fin-like structures, and a well, respectively. FIG. 3 illustrates a cross-sectional view of the example semiconductor device 100, cut along line B-B (as indicated in FIG. 1A), where a source/drain structure is formed. FIGS. 4A and 4B illustrate cross-sectional views of the example semiconductor device 100, cut along line C-C (as indicated in FIG. 1A), with and without a deep well, respectively.

Referring first to FIG. 1A, the transistors 102 and 104 are formed over an active region, or structure, 101 that is configured to conduct current flowing therethrough. The active structure 101 may extend along a first lateral direction, e.g., the X direction. As such, the active structure 101 is sometimes referred to as having a lengthwise direction along the X direction. In some embodiments, the active structure 101 may be formed as a three-dimensional structure vertically (e.g., along the Z direction) protruding from a substrate. By forming the active structure as a three-dimensional structure, the transistors 102 and 104 can have improved gate controllability.

For example, the active structure 101 may include a mesa-like structure. Such a mesa-like structure may protrude from a substrate, with a relatively wide top surface and at least a portion of its sidewalls protruding from a top surface of the substrate, which will be discussed in further detail below in FIG. 2A. In another example, the active structure

101 may include a number of fin-like structures. Each of the fin-like structures may protrude from a substrate, with a relatively narrow top surface and at least a portion of its sidewalls protruding from a top surface of the substrate, which will be discussed in further detail below in FIG. 2B. In some other embodiments, the active structure 101 may be formed as a two-dimensional structure. Such a two-dimensional structure may include a well formed near the top surface of a substrate, which will be discussed in further detail below in FIG. 2C.

Over the active structure 101, the transistor 102 includes a first gate structure 106 and a second gate structure 108, each of which extends along a second lateral direction (e.g., the Y direction); and the transistor 104 includes a second gate structure 110 and a first gate structure 112, each of which extends along the second lateral direction (e.g., the Y direction). In some embodiments, the first gate structures 106 and 112 may be formed as having a first length (extending along the X direction), $L_1$, and the second gate structures 108 and 110 may be formed as having a second length (extending along the X direction), $L_2$. In various embodiments, the first gate structure can extend over two regions of the active structure 101, having opposite conductivity types, and overlay a region interposed between those two regions, while the second gate structure can overlay one of these two regions (which will be discussed below in FIGS. 2A-B). As such, the first length $L_1$ may be greater than the second length $L_2$. In a non-limiting example, $L_1$ may range from about 0.5 microns (μm) to about 6 μm, and $L_2$ may range from about 0.08 μm to about 1 μm. Further, the first and second gate structures of each transistor may be separated by a distance, D (extending along the X direction), which may range from about 0.11 μm to about 0.2 μm. Still further, the second gate structures of the transistors 102 and 104 may be separated by the same distance D.

Further, in or over the active structure 101, the transistor 102 includes a first source/drain structure 114 and a common source/drain structure 116; and the transistor 104 includes a first source/drain structure 118 and the common source/drain structure 116. In the transistor 102, the first source/drain structure 114 may be formed opposite the first gate structure 106 from the region between the first and second gate structures 106 and 108, and the common source/drain structure 116 may be formed opposite the second gate structure 108 from the region between the first and second gate structures 106 and 108. In the transistor 104, the first source/drain structure 118 may be formed opposite the first gate structure 112 from the region between the second and first gate structures 110 and 112, and the common source/drain structure 116 may be formed opposite the second gate structure 110 from the region between the second and first gate structures 110 and 112. Accordingly, the semiconductor device 100 may have the respective structure of the transistors 102 and 104 mirrored from each other. For example, the second gate structures 108 and 110 mirror each other with respect to the common source/drain structure 116, and the first gate structures 106 and 112 mirror each other with respect to the common source/drain structure 116. The transistors 102 and 104 may share the common source/drain structure 116. As such, the transistors 102 and 104 may be electrically coupled to each other in series, in some embodiments.

On the side of the source/drain structure 114 opposite to where the first gate structure 106 is formed, the transistor 102 can include a dummy gate structure 120. Similarly, on the side of the source/drain structure 118 opposite to where the first gate structure 112 is formed, the transistor 104 can include a dummy gate structure 122. In various embodiments, such dummy gate structures may be formed concurrently with the (active) gate structures 106-112, but are not electrically connected to any contacts. To operate the semiconductor device 100, the gate structures 106-112 and the source/drain structures 114-118 may be electrically coupled to respective contacts, while the dummy gate structures 120-122 are not. For example in FIG. 1A, the gate structures 106-112 and the source/drain structures 114-118 are coupled to contacts 124, 126, 128, 130, 132, 134, and 136, respectively.

Referring then to FIG. 1B, the semiconductor device 150 includes two high-voltage transistors 152 and 154, in accordance with various embodiments. The semiconductor device 150 is substantially similar to the semiconductor device 100 of FIG. 1A except that each of the transistors 152 and 154 includes an additional gate structure. For example, the transistors 152 and 154 are formed over an active structure 151, which is substantially similar to the active structure 101. The transistor 152 has gate structures 156 and 158, which are substantially similar to the gate structures 106 and 108, respectively; and the transistor 154 has gate structures 164 and 166, which are substantially similar to the gate structures 110 and 112, respectively. The transistor 152 has source/drain structures 168 and a common source/drain structure 170, which are substantially similar to the source/drain structures 114 and 116, respectively; and the transistor 154 has source/drain structures 172 and the common source/drain structure 170, which are substantially similar to the source/drain structures 118 and 116, respectively. In some embodiments, the transistor 152 can have one or more additional gate structures, e.g., 160; and the transistor 154 can have one or more additional gate structures, e.g., 162. Such an additional gate structure may be configured similarly to the second gate structure in the dimensions (e.g., the length $L_2$, and the distance D separating it from an adjacent gate structure) and the operation voltage. It should be understood that the disclosed high-voltage transistor can include any number of additional gate structures, while remaining within the scope of the present disclosure.

By forming the second gate structure (and additional gate structure(s)) between the first gate structure and one of the source/drain structures, such a source/drain structure can be separated apart from the first gate structure farther. The electrical field at that source/drain structure can thus be less subjected to the high voltage applied to the first gate structure. Further, the second gate structure (and the additional gate structure(s)) are each applied with a voltage having a polarity opposite to a polarity of the voltage applied to the first gate structure. As a result, the current flowing through each transistor can be "rerouted" away from the second gate structure. A hot carrier (or punch through) effect, which is typically induced between the gate structures and the source/drain structures by the high electric field, can be advantageously avoided. Moreover, operation voltage of the disclosed high-voltage transistor can be significantly increased, e.g., by at least two times. In the following cross-sectional discussions, the semiconductor device 100 of FIG. 1A, in which each of the high-voltage transistors has two active gate structures, is selected as a representative example.

Referring to FIG. 2A where the cross-sectional view is cut along line A-A (FIG. 1A), the active structure 101 is formed as a three-dimensional structure such as, for example, a mesa-like structure, in accordance with various embodiments. For example, the mesa-like active structure 101 protrudes from a substrate 10. The mesa-like active structure 101 has a lower portion 101L and an upper portion 101U, in which the lower portion 101L is embedded by an isolation structure 202 and the upper portion 101U is exposed with respect to the isolation structure 202. The isolation structure 202 is sometimes referred to as a shallow trench isolation (STI). As such, a top surface 101T and portions of sidewalls 101S of the mesa-like active structure 101 can be coupled to (e.g., in physical contact with) the gate structure 106. Alternatively stated, the gate structure 106 straddles the mesa-like active structure 101. Although the semiconductor device 100 includes a single active structure in the current example (e.g., FIG. 1A), it should be understood that the semiconductor device 100 (and 150) can include multiple active structures, each of which is parallel with one another, while remaining within the scope of the present disclosure. In such embodiments, the isolation structure 202 is disposed between adjacent active structures.

Referring to FIG. 2B where the cross-sectional view is cut along line A-A (FIG. 1A), the active structure 101 is formed as a three-dimensional structure such as, for example, a number of fin-like structures, in accordance with various embodiments. For example, each of the fin-like active structures 101 protrudes from a substrate 10, and is parallel with one another. The fin-like active structure 101 has a lower portion 101L and an upper portion 101U, in which the lower portion 101L is embedded by an isolation structure 202 and the upper portion 101U is exposed with respect to the isolation structure 202. The isolation structure 202 is sometimes referred to as a shallow trench isolation (STI). As such, a top surface 101T and portions of sidewalls 101S of each of the fin-like active structure 101 can be coupled to (e.g., in physical contact with) the gate structure 106. Alternatively stated, the gate structure 106 straddles each of the fin-like active structures 101. As shown, the isolation structure 202 is disposed between adjacent ones of the fin-like active structures.

Referring to FIG. 2C where the cross-sectional view is cut along line A-A (FIG. 1A), the active structure 101 is formed as a two-dimensional structure such as, for example, a well, in accordance with various embodiments. For example, the well 101, formed near a top surface of a substrate 10, extends into the substrate 100 with a certain depth. The well 101 is embedded by an isolation structure 202 that also extends into the substrate 100. In some embodiments, the isolation structure 202 and the well 101 may share a coplanar top surface. The isolation structure 202 is sometimes referred to as a shallow trench isolation (STI). As such, a top surface 101T of the well 101 can be coupled to (e.g., in physical contact with) the gate structure 106, and sidewalls 101S of the well 101 can be coupled to (e.g., in physical contact with) the isolation structure 202.

Referring to FIG. 3 where the cross-sectional view is cut along line B-B (FIG. 1A), the source/drain structure 114 is formed in or over the active structure 101. The source/drain structure 114 in the illustrated example of FIG. 3 may be epitaxially grown over a recessed portion of the three-dimensional active structure 101 (e.g., as discussed with respect to FIGS. 2A-B). Details of growing such source/drain structures will be discussed below. Although the source/drain structure 114 has a bottom surface aligned with the top surface of the isolation structure 202, it should be understood that the bottom surface may be formed lower than the top surface of the isolation structure 202, while remaining within the scope of the present disclosure.

Referring to FIG. 4A where the cross-sectional view is cut along line C-C (FIG. 1A), the active structure 101 includes multiple regions (or structures) 402, 404, 406, 408, and 410.

In the example where the active structure 101 is formed as a mesa-like structure, the regions 402, 404, 406, 408, and 410 may sometimes be referred to as mesa-like structures 402, 404, 406, 408, and 410, respectively, in some embodiments. In the example where the active structure 101 is formed as a number of fin-like structures, the regions 402, 404, 406, 408, and 410 may sometimes be referred to as fin-like structures 402, 404, 406, 408, and 410, respectively, in some embodiments. In the example where the active structure 101 is formed as a well-like structure, the regions 402, 404, 406, 408, and 410 may sometimes be referred to as well-like structures 402, 404, 406, 408, and 410, respectively, in some embodiments.

In various embodiments, respective conductivity types of the regions 402-410 may change in accordance with a conduction mechanism of the transistors 102 and 104. For example, when the transistors 102 and 104 are configured as conducting electrons (which are typically referred to as n-type devices), the regions 402 and 406 may be configured in p-type, the region 404 may be configured in n-type, and the regions 408 and 410 interposed between the regions 402 and 404 and interposed between the regions 406 and 404, respectively, may be configured in the same conductivity type as the substrate 10 (e.g., p-type). Further, the source/drain structures 114-118 may each be configured in n-type, with a higher concentration than the regions 402-410. When the transistors 102 and 104 are configured as conducting holes (which are typically referred to as p-type devices), the regions 402 and 406 may be configured in n-type, the region 404 may be configured in p-type, and the regions 408 and 410 interposed between the regions 402 and 404 and interposed between the regions 406 and 404, respectively may be configured in the same conductivity type as the substrate 10 (e.g., p-type). Further, the source/drain structures 114-118 may each be configured in p-type, with a higher concentration than the regions 402-410.

As shown, for the transistor 102, the gate structure 106 extends over (e.g., straddles) a first portion of the region 402, the interposed region 408, and a first portion of the region 404. The gate structure 108 extends over (e.g., straddles) a second portion of the region 404. Further, the source/drain structure 114 is formed in a second portion of the region 402, with a third portion of the region 402 straddled by the dummy gate structure 120. For the transistor 104, the gate structure 112 extends over (e.g., straddles) a first portion of the region 406, the interposed region 410, and a third portion of the region 404. The gate structure 110 extends over (e.g., straddles) a fourth portion of the region 404. Further, the source/drain structure 118 is formed in a second portion of the region 406, with a third portion of the region 406 straddled by the dummy gate structure 122. Regarding the common source/drain structure 116, it is formed in a fifth portion of the region 404.

To operate the semiconductor device 100 (when the transistors 102 and 104 are configured in n-type, for example), the first gate structures 106 and 112 can be applied with a positive voltage (e.g., 5 V) and the second gate structures 108 and 110 can be applied with a negative voltage (e.g., −5 V), where the source/drain structures 114 and 118 are grounded and the common source/drain structure 116 is applied with a positive voltage (e.g., 5 V). The voltages can be applied through respective contacts 124-136 formed in an interlayer dielectric (ILD) 402. By applying a voltage with the opposite polarity on the second gate structures, each of the transistors 102 and 104 can experience a less frequently occurred hot carrier effect around the second gate structures 108/110 by rerouting a conduction path (e.g., 401) away from the second gate structures 108/110. Further, each of the transistors 102 and 104 can experience a relatively large voltage drop, e.g., 10 V in the current example.

FIG. 4B illustrates the cross-sectional view of the semiconductor device 100 including a deep well 420, in accordance with various embodiments. The deep well 420 may be formed in a lower portion of the region 404, alternatively stated, in a region of the lower portion 101L. When the transistors 102 and 104 are configured as n-type devices, the deep well 420 may be configured in p-type; and when the transistors 102 and 104 are configured as p-type devices, the deep well 420 may be configured in n-type. Forming the deep well can further keep the conduction path (e.g., 401 of FIG. 4A) away from the second gate structures 108/110. In some other embodiments, the deep well 420 may laterally extend into the interposed regions 408 and 410, the region 402 and/or the region 406.

Figure 5:
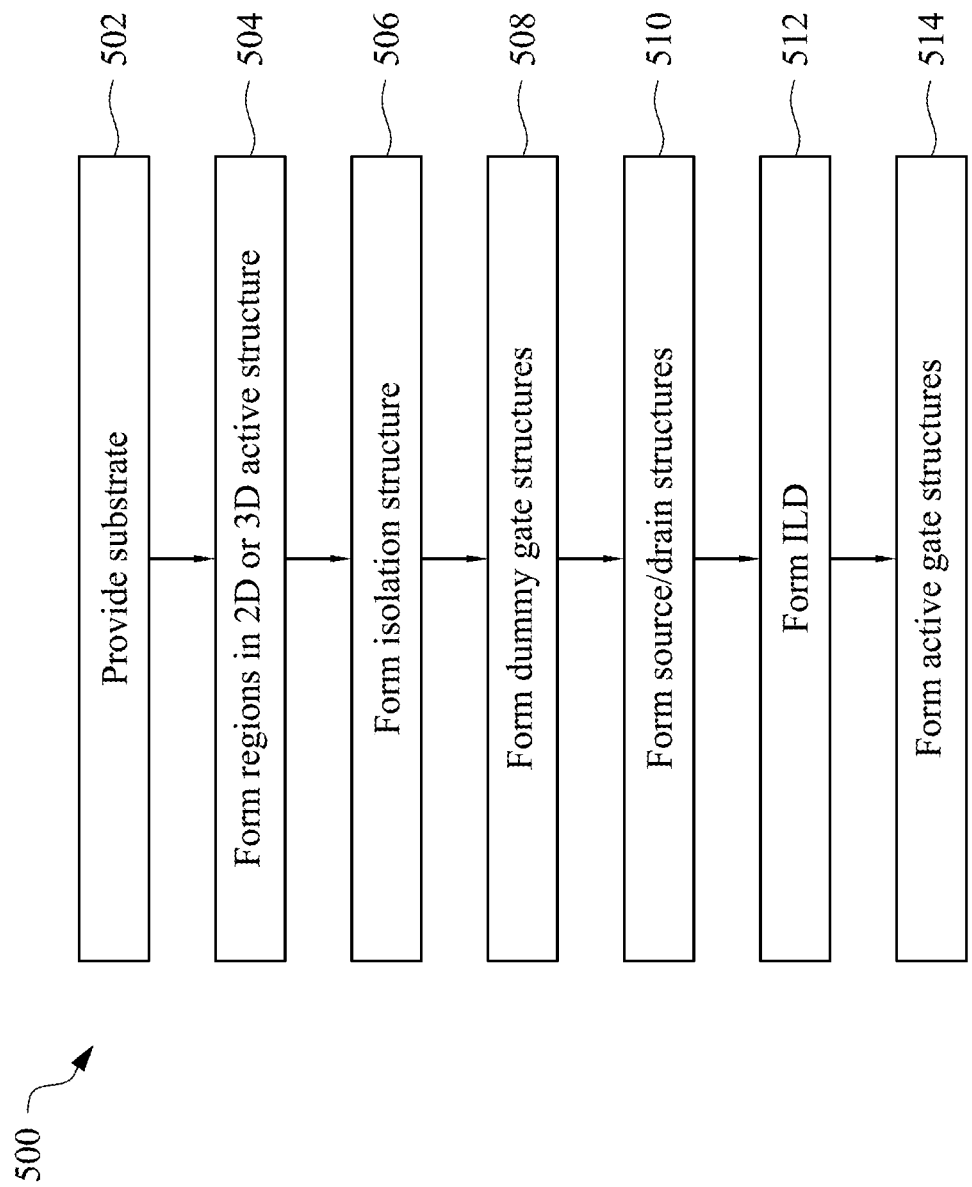
FIG. 5 illustrates a flow chart of a method to make the example semiconductor device of FIG. 1A, in accordance with some embodiments.

FIG. 5 illustrates a flowchart of a method 500 to form a semiconductor device that includes one or more high-voltage transistors, according to one or more embodiments of the present disclosure. In some embodiments, operations of the method 500 may be associated with the cross-sectional or top views of the semiconductor device 100 at various fabrication stages. Thus, the reference numerals of FIGS. 1A-4B may sometimes be used in the following discussions. It is noted that the method 500 is merely an example, and is not intended to limit the present disclosure. Accordingly, it should be understood that additional operations may be provided before, during, and after the method 500 of FIG. 5, and that some other operations may only be briefly described herein.

The method 500 starts with operation 502 of providing a substrate, e.g., 100 of FIGS. 1A-4B, at one of the various stages of fabrication, in accordance with various embodiments. The substrate 10 may be a semiconductor substrate, such as a bulk semiconductor, a semiconductor-on-insulator (SOI) substrate, or the like, which may be doped (e.g., with a p-type or an n-type dopant) or undoped. The substrate 10 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The method 500 continues to operation 504 of forming a number of three-dimensional semiconductor or two-dimensional semiconductor structures (or regions), e.g., 402-410 of FIGS. 1A-4B, at one of the various stages of fabrication, in accordance with various embodiments. Using the regions 402-410 formed in the mesa-like active structure 101 (FIGS. 2A, 3, and 4A-B) as a representative example, the regions 402-410 may be formed by doping the substrate 10 with respective conductivity types and concentrations (as wells that extend into the substrate 10). Then, the mesa-like active structure 101 is formed by patterning the substrate 10, including the doped wells (hereinafter "doped substrate 10"), using, for example, photolithography and etching techniques. For example, a mask layer, such as a pad oxide layer and an overlying pad nitride layer, is formed over the doped substrate 10. The pad oxide layer may be a thin film comprising silicon oxide formed, for example, using a thermal oxidation process. The pad oxide layer may act as an adhesion layer between the doped substrate 10 and the overlying pad nitride layer. In some embodiments, the pad nitride layer is formed of silicon nitride, silicon oxynitride, silicon carbo nitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask is subsequently used to pattern exposed portion(s) of the doped substrate 10 to form trenches (or openings), thereby defining the mesa-like active structure 101 between adjacent trenches. When multiple mesa-like active structures are formed, such a trench may be disposed between any adjacent ones of the mesa-like active structures. In some embodiments, the mesa-like active structure 101 is formed by etching trenches in the doped substrate 10 using, for example, reactive ion etch (RIE), neutral beam etch (NBE), the like, or combinations thereof. The etching may be anisotropic. In some embodiments, the trenches may be strips (viewed from the top) parallel to each other, and closely spaced with respect to each other. In some embodiments, the trenches may be continuous and surround the mesa-like active structure 101.

The mesa-like active structure 101 may be patterned by any suitable method. For example, the mesa-like active structure 101 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the mesa-like active structure 101.

The method 500 continues to operation 506 of forming an isolation structure, e.g., 202 of FIGS. 2A-2C and 3, over the substrate, at one of the various stages of fabrication, in accordance with various embodiments. The isolation structure 202, which is formed of an insulation material, can electrically isolate neighboring active structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In some embodiments, the insulation material is silicon oxide formed by a FCVD process. An anneal process may be performed once the insulation material is formed. A planarization process, such as a chemical mechanical polish (CMP), may remove any excess insulation material and form top surfaces of the isolation structure 202 and a top surface of the active structure that are coplanar (not shown, the isolation structure 202 will be recessed as shown in FIGS. 2A-C and 3). The patterned mask, as described above to define the active structure, may also be removed by the planarization process.

In some embodiments, the isolation structure 202 includes a liner, e.g., a liner oxide (not shown), at the interface between the isolation structure 202 and the substrate 10 (the active structure 101). In some embodiments, the liner oxide is formed to reduce crystalline defects at the interface between the substrate 10 and the isolation structure 202. Similarly, the liner oxide may also be used to reduce crystalline defects at the interface between the active structure 101 and the isolation structure 202. The liner oxide (e.g., silicon oxide) may be a thermal oxide formed through a thermal oxidation of a surface layer of the substrate 100, although other suitable method may also be used to form the liner oxide.

Next, the isolation structure 202 is recessed to form a shallow trench isolation (STI), as shown in FIGS. 2A-C and 3. The isolation structure 202 is recessed such that the upper portion of the active structure (e.g., 101U) protrudes from between neighboring isolation structures 202. Respective top surfaces of the isolation structures 202 may have a flat surface (as illustrated), a convex surface, a concave surface (such as dishing), or combinations thereof. The top surfaces of the isolation structures 202 may be formed flat, convex, and/or concave by an appropriate etch. The isolation structure 202 may be recessed using an acceptable etching process, such as one that is selective to the material of the isolation structure 202. For example, a dry etch or a wet etch using dilute hydrofluoric (DHF) acid may be performed to recess the isolation structure 202.

The method 500 continues to operation 508 of forming one or more dummy gate structures over the active structure, at one of the various stages of fabrication, in accordance with various embodiments. Some of the dummy gate structures may be replaced with active gate structures, e.g., 106-112 of FIGS. 1A-4B, and some of the dummy gate structures may remain, e.g., 120-122 of FIGS. 1A-4B.

The dummy gate structures can each include a dummy gate dielectric and a dummy gate. To form the dummy gate structures, a dielectric layer is formed on the fin. The dielectric layer may be, for example, silicon oxide, silicon nitride, multilayers thereof, or the like, and may be deposited or thermally grown. A gate layer is formed over the dielectric layer, and a mask layer is formed over the gate layer. The gate layer may be deposited over the dielectric layer and then planarized, such as by a CMP. The mask layer may be deposited over the gate layer. In various embodiments of the present disclosure, the gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to pattern the mask. The pattern of the mask then may be transferred to the gate layer and the dielectric layer by an acceptable etching technique to form the dummy gate and the underlying dummy gate dielectric, respectively.

The method 500 continues to operation 510 of forming source/drain structures, e.g., 114-118 of FIGS. 1A-4B, at one of the various stages of fabrication, in accordance with various embodiments. The source/drain structures 114-118 are formed in recesses of the active structure adjacent to the dummy gate structures. The recesses are formed by, e.g., an anisotropic etching process using the dummy gate structures as an etching mask, in some embodiments, although any other suitable etching process may also be used. The source/drain structures are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

The method 500 continues to operation 512 of forming an interlayer dielectric (ILD), e.g., 412 of FIGS. 4A-B, at one of the various stages of fabrication, in accordance with various embodiments. The ILD 412 is formed over a contact etch stop layer (CESL) and over the dummy gate structures. In some embodiments, the ILD 412 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 412 is formed, a protection dielectric layer (not shown) is formed over the ILD 412. The protection dielectric layer can prevent or reduce the loss of the ILD 412 in subsequent etching processes. The protection dielectric layer may be formed of a suitable material, such as silicon nitride, silicon carbonitride, or the like, using a suitable method such as CVD, PECVD, or FCVD. After the protection dielectric layer is formed, a planarization process, such as a CMP process, may be performed to achieve a level upper surface for the protection dielectric layer. After the planarization process, the upper surface of the protection dielectric layer is level with the upper surface of the dummy gate structures, in some embodiments.

The method 500 continues to operation 514 of forming one or more active gate structures, e.g., 106-112 of FIGS. 1A-4B, at one of the various stages of fabrication, in accordance with various embodiments. The active gate structure can include a gate dielectric layer, a metal gate layer, and one or more other layers. The gate dielectric layer includes silicon oxide, silicon nitride, or multilayers thereof. In example embodiments, the gate dielectric layer includes a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of gate dielectric layer may include molecular beam deposition (MBD), atomic layer deposition (ALD), PECVD, and the like. The metal gate layer is formed over the gate dielectric layer. The metal gate layer may be a P-type work function layer, an N-type work function layer, multi-layers thereof, or combinations thereof, in some embodiments. Accordingly, the metal gate layer is sometimes referred to as a work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

In one aspect of the present disclosure, a semiconductor device is disclosed. The semiconductor device includes a semiconductor substrate. The semiconductor device includes a first three-dimensional semiconductor structure of a first conductivity type protruding from a surface of the semiconductor substrate. The semiconductor device includes a second three-dimensional semiconductor structure of a second conductivity type protruding from the surface of the semiconductor substrate. The semiconductor device includes a first transistor having a first source/drain structure formed in the first three-dimensional semiconductor structure, a second source/drain structure formed in the second three-dimensional semiconductor structure, a first gate structure straddling a first portion of the first three-dimensional semiconductor structure and a first portion of the second three-dimensional semiconductor structure, and a second gate structure straddling a second portion of the second three-dimensional semiconductor structure.

In another aspect of the present disclosure, a semiconductor device is disclosed. The semiconductor device includes a semiconductor substrate. The semiconductor device includes a first semiconductor structure of a first conductivity type formed over the semiconductor substrate. The semiconductor device includes a second semiconductor structure of a second conductivity type formed over the semiconductor substrate. The semiconductor device includes a third semiconductor structure of the first conductivity type formed over the semiconductor substrate, wherein the second semiconductor structure is disposed between the first and second semiconductor structures along a direction. The semiconductor device includes a first high-voltage transistor having a first source/drain structure formed in the first semiconductor structure, a first gate structure formed over the first and second semiconductor structures, a second gate structure formed over the second semiconductor structure, and a second source/drain structure formed in the second semiconductor structure. The semiconductor device includes a second high-voltage transistor having the second source/drain structure, a third gate structure formed over the third and second semiconductor structures, a fourth gate structure formed over the second semiconductor structure, and a third source/drain structure formed in the third semiconductor structure.

In yet another aspect of the present disclosure, a method for fabricating a semiconductor device is disclosed. The method includes forming a three-dimensional semiconductor structure protruding from a surface of a semiconductor substrate. The method includes defining a first region, a second region, and a third region in the three-dimensional semiconductor structure. The first and third regions have a first conductivity type and the second region has a second conductivity type. The method includes forming a first source/drain structure in the first region, a second source/drain structure in the second region, and a third source/drain structure in the third region. The method includes forming a first gate structure, a second gate structure, a third gate structure, and a fourth gate structure. The first gate structure straddles a portion of the first region and a first portion of the second region, the second gate structure straddles a second portion of the second region, the third gate structure straddles a portion of the third region and a third portion of the second region, and the fourth gate structure straddles a fourth portion of the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a first three-dimensional semiconductor structure of a first conductivity type protruding from a surface of the semiconductor substrate;
   a second three-dimensional semiconductor structure of a second conductivity type protruding from the surface of the semiconductor substrate; and
   a first transistor having:
      a first source/drain structure formed in the first three-dimensional semiconductor structure;
      a second source/drain structure formed in the second three-dimensional semiconductor structure;
      a first gate structure straddling a first portion of the first three-dimensional semiconductor structure and a first portion of the second three-dimensional semiconductor structure; and
      a second gate structure straddling a second portion of the second three-dimensional semiconductor structure.

2. The semiconductor device of claim 1, further comprising:
   a third three-dimensional semiconductor structure of the first conductivity type protruding from the surface of the semiconductor substrate; and
   a second transistor having:
      the second source/drain structure;
      a third source/drain structure formed in the third three-dimensional semiconductor structure;
      a third gate structure straddling a first portion of the third three-dimensional semiconductor structure and a third portion of the second three-dimensional semiconductor structure; and
      a fourth gate structure straddling a fourth portion of the second three-dimensional semiconductor structure.

3. The semiconductor device of claim 2, wherein the first and third gate structures mirror each other with respect to the second source/drain structure, and the second and fourth gate structures mirror each other with respect to the second source/drain structure.

4. The semiconductor device of claim 2, further comprising:
   a first dummy gate structure straddling a second portion of the first three-dimensional semiconductor structure; and
   a second dummy gate structure straddling a second portion of the third three-dimensional semiconductor structure,
   wherein the first dummy gate structure is disposed opposite the first source/drain structure from the first gate structure, and the second dummy gate structure is disposed opposite the third source/drain structure from the third gate structure.

5. The semiconductor device of claim 1, wherein the first gate structure has a first length extending along a direction in which the first source/drain structure, the first gate structure, the second gate structure, and the second source/drain structure are arranged with respect to one another, and the second gate structure has a second length extending along the direction, and wherein the first length is greater than the second length.

6. The semiconductor device of claim 5, wherein the first length is between about 0.5 µm to about 6 µm, and the second length is between about 0.08 µm to about 1 µm.

7. The semiconductor device of claim 1, wherein the first and second gate structures are separated by a distance that is between about 0.11 µm to about 0.2 µm.

8. The semiconductor device of claim 1, further comprising a deep well immediately below the second three-dimensional semiconductor structure, wherein the deep well has the first conductivity type.

9. The semiconductor device of claim 8, further comprising an isolation structure surrounding the deep well.

10. The semiconductor device of claim 9, wherein each of the first and second three-dimensional semiconductor structures also protrudes from a surface of the isolation structure.

11. The semiconductor device of claim 1, wherein the first gate structure is applied with a first voltage having a first polarity and the second gate structure is applied with a second voltage having a second polarity opposite to the first polarity, such that the first transistor produces an operable voltage range equal to an absolute value of the first voltage plus an absolute value of the second voltage.

12. A semiconductor device, comprising:
a semiconductor substrate;
a first semiconductor structure of a first conductivity type formed over the semiconductor substrate;
a second semiconductor structure of a second conductivity type formed over the semiconductor substrate;
a third semiconductor structure of the first conductivity type formed over the semiconductor substrate, wherein the third semiconductor structure is disposed between the first and second semiconductor structures along a direction;
a first high-voltage transistor having:
a first source/drain structure formed in the first semiconductor structure;
a first gate structure formed over the first and second semiconductor structures;
a second gate structure formed over the second semiconductor structure; and
a second source/drain structure formed in the second semiconductor structure; and
a second high-voltage transistor having:
the second source/drain structure;
a third gate structure formed over the third and second semiconductor structures;
a fourth gate structure formed over the second semiconductor structure; and
a third source/drain structure formed in the third semiconductor structure.

13. The semiconductor device of claim 12, wherein the first, second, and third semiconductor structures each include a well formed near a surface of the semiconductor substrate.

14. The semiconductor device of claim 12, wherein the first, second, and third semiconductor structures each include a single three-dimensional semiconductor structure protruding from a surface of the semiconductor substrate.

15. The semiconductor device of claim 12, wherein the first, second, and third semiconductor structures each include a plurality of three-dimensional semiconductor structures protruding from a surface of the semiconductor substrate.

16. The semiconductor device of claim 12, wherein the first and third gate structures mirror each other with respect to the second source/drain structure, and the second and fourth gate structures mirror each other with respect to the second source/drain structure.

17. The semiconductor device of claim 12, wherein the first and third gate structures have a first length extending along the direction, and the second and fourth gate structures have a second length extending along the direction, and wherein the first length is greater than the second length.

18. The semiconductor device of claim 12, wherein the first gate structure straddles a portion of the first semiconductor structure and a first portion of the second semiconductor structure, the second gate structure straddles a second portion of the second semiconductor structure, the third gate structure straddles a portion of the third semiconductor structure and a third portion of the second semiconductor structure, and the fourth gate structure straddles a fourth portion of the second semiconductor structure.

19. A semiconductor device, comprising:
a semiconductor substrate;
a first semiconductor structure of a first conductivity type formed over the semiconductor substrate;
a second semiconductor structure of a second conductivity type formed over the semiconductor substrate;
a third semiconductor structure of the first conductivity type formed over the semiconductor substrate, wherein the third semiconductor structure is disposed between the first and second semiconductor structures along a direction;
a first high-voltage transistor having:
a first source/drain structure formed in the first semiconductor structure;
a first gate structure formed over the first and second semiconductor structures;
a second gate structure formed over the second semiconductor structure; and
a second source/drain structure formed in the second semiconductor structure; and
a second high-voltage transistor having:
the second source/drain structure;
a third gate structure formed over the third and second semiconductor structures; and
a fourth gate structure formed over the second semiconductor structure.

20. The semiconductor device of claim 19, wherein the first, second, and third semiconductor structures each include a well formed near a surface of the semiconductor substrate.

* * * * *